(12) United States Patent
Kuramoto

(10) Patent No.: US 7,183,585 B2
(45) Date of Patent: Feb. 27, 2007

(54) SEMICONDUCTOR DEVICE AND A METHOD FOR THE MANUFACTURE THEREOF

(75) Inventor: Masaru Kuramoto, Tokyo (JP)

(73) Assignee: NEC Corporation, Tokyo (JP)

( * ) Notice: Subject to any disclaimer, the term of this patent is extended or adjusted under 35 U.S.C. 154(b) by 48 days.

(21) Appl. No.: 10/975,884

(22) Filed: Oct. 28, 2004

(65) Prior Publication Data

US 2005/0093009 A1     May 5, 2005

(30) Foreign Application Priority Data

Oct. 29, 2003    (JP) ................ 2003-369408

(51) Int. Cl.
*H01L 29/22* (2006.01)

(52) U.S. Cl. .......... 257/98; 257/64; 257/255; 257/521; 257/628; 257/507; 257/E21.121; 257/E21.13

(58) Field of Classification Search ............ None
See application file for complete search history.

(56) References Cited

U.S. PATENT DOCUMENTS 5,994,205 A * 11/1999 Yamamoto et al. ......... 438/464

2004/0169185 A1 * 9/2004 Liu ............................ 257/96

FOREIGN PATENT DOCUMENTS

| JP | 60-123086 | 7/1985 |
|---|---|---|
| JP | 6-5703 | 1/1994 |
| JP | 10-70335 | 3/1998 |
| JP | 2001-85736 | 3/2001 |
| JP | 2001085736 A * | 3/2001 |
| JP | 2001-185798 | 7/2001 |
| JP | 2002-185085 | 6/2002 |
| JP | 2003-17790 | 1/2003 |
| JP | 2003-86900 | 3/2003 |

* cited by examiner

*Primary Examiner*—Leonardo Andujar
*Assistant Examiner*—Scott R. Wilson
(74) *Attorney, Agent, or Firm*—Scully, Scott, Murphy & Presser, P.C.

(57) ABSTRACT

To provide a semiconductor device that excels in the manufacturing efficiency and device reliability, and a method for the manufacture thereof. The side of a device is composed of scribed grooves 13 and a cleavage plane 100.

13 Claims, 7 Drawing Sheets

⟶ ⟨1-100⟩

SEMICONDUCTOR DEVICE AND A METHOD FOR THE MANUFACTURE THEREOF

BACKGROUND OF THE INVENTION

1. Field of the invention

The present invention relates to a semiconductor device and a method for the manufacture thereof.

2. Description of the Related Art

GaN-based semiconductor materials, represented by gallium nitride have attracted public attention as materials for light-emitting diodes (LEDs) or laser diodes (LDs), since they emit blue-violet light at high efficiency. Above all, LDs are expected as the light sources for large-capacity optical disk devices, and in recent years, high-output LDs have been energetically performed as the light sources for writing.

Heretofore, semiconductor devices using GaN-based semiconductor materials have been fabricated utilizing the substrates of heterogeneous materials, such as sapphire and SiC. Specifically, a wurtzite-type GaN (0001) layer has been grown on a sapphire substrate or a SiC substrate using a two-step growing method, and a device structure has been fabricated using such a GaN layer as the substrate. This is because high-quality bulk GaN single crystal substrates have not been available.

However, when these heterogeneous substrates were used, a high-density crystal transition was introduced in the GaN layer due to difference in the lattice constants between the substrate and GaN, and it was difficult to obtain high-quality single crystals. Furthermore, sapphire substrates have various problems in practice; such as poor heat dissipation of the device characteristic due to low thermal conductivity; difficulty of mirror in the fabrication of LDs due to difference in cleaved surfaces between GaN and sapphire; and impossibility of fabricating back-electrode-type devices due to an insulator.

Under such situations, a technique for obtaining high-quality GaN substrates of low crystal transition has been studied by combining a GaN thick film growing technique utilizing HVPE (Hybrid Vapor Phase Epitaxy) and a crystal transition reducing technique. By using a GaN substrate having good thermal conduction characteristics and electric conduction characteristics, the improvement of heat-dissipation properties and the realization of a back-electrode-type semiconductor laser are expected. It is considered that the devices on GaN substrate will be the mainstream in the future.

When a method for manufacturing a semiconductor device using a GaN substrate is adopted, a large number of problems in processing must be solved. As one of such problems, an important technical problem is how to divide a semiconductor layer grown on a substrate into dies. Heretofore, since a red light emitting semiconductor laser diodes used in communications or DVDs has used a semiconductor material having a cubic system structure, when the end surface of a laser resonator is perpendicular to the chip separation direction, the cleavage plane of the crystal can be utilized in both directions. However, a GaN substrate having a wurtzite-type crystal structure has no cleaved plane in two directions orthogonal to each other of the wafer surface, and a rectangular chip cannot be formed using cleavage only. Since GaN is hexagonal system, if the <1-100> direction is the cleaved surface (LD end face), the cleaving direction, which is the direction easiest to cleave, is present only in the 60° directions thereof. Therefore, in order to separate a laser device composed of laser end surfaces from a stripe direction, stripe intervals must be wide, lowering the yield of devices and increasing the costs.

As a method for chip separation of a nitride semiconductor laser, Japanese Patent Application Laid-Open No. 2002-185085 discloses a method for separating devices wherein the back face of a substrate is scribed in the (11-20) direction to make the roughness thereof 300 angstrom or below. Japanese Patent Application Laid-Open No. 2001-85736 discloses a technique wherein a notch is formed on the GaN substrate side of a wafer, the surface of the crystal-growing side is scribed, and a roller is pressed onto the crystal-growing side to fabricated a chip.

However, when these methods are adopted, an additional process for reducing the roughness of the substrate is required, causing the process efficiency to lower and the production costs to increase.

The GaN substrate is very hard, and if it is cut in the plane other than the cleavage plane, cracks are easily produced. Therefore, during chip separation, crystal defects have often occurred, or cracks have often been produced.

Also when the LD end surface is coated, the coating has often been peeled off because the end surface is scribed.

Such problems are especially marked in regions where dislocation density is low.

The present invention has been devised considering the above-described circumstance, and it is the object of the present invention to provide a semiconductor device that excels in manufacturing efficiency and device reliability, and a method for manufacturing such a semiconductor device.

SUMMARY OF THE INVENTION

According to the present invention, there is provided a semiconductor device comprising a crystalline substrate, and a semiconductor layer laminated on said crystalline substrate; wherein at least one side of said semiconductor device includes a first surface consisting of the crystal face of said crystalline substrate, and a second surface consisting of a surface other than the crystal face of said crystalline substrate.

The semiconductor device of the present invention includes at least one side thereof includes a first surface consisting of the crystal face of the crystalline substrate, and a second surface consisting of a surface other than the crystal face of the crystalline substrate.

According to the present invention, there is also provided a method for manufacturing a semiconductor device comprising: a step for forming a semiconductor layer on a crystalline substrate; a step for selectively removing the crystalline substrate or the semiconductor layer, and forming a plurality of grooves extending in a direction on a part of a device separating region; a step for cutting the crystalline substrate and the semiconductor layer along a surface substantially orthogonal to the extending direction of the grooves, and not intersecting the grooves to form a bar; and a step for performing breaking along the extending direction of the grooves, cutting the crystalline substrate and the semiconductor layer along the grooves, and cleaving the crystalline substrate and the semiconductor layer in the area where the grooves are not formed to separate devices and to form the semiconductor device.

According to the present invention, there is also provided a method for manufacturing a semiconductor device comprising: a step for forming a plurality of striped masks extending in a direction on a crystalline substrate; a step for selectively growing a semiconductor layer while forming grooves from the opening of the mask to immediately above the mask; a step for cutting the crystalline substrate and the semiconductor layer along a surface substantially orthogonal to the extending direction of the grooves, and not intersecting the grooves to form a bar; and a step for performing breaking along the extending direction of the grooves, cutting the crystalline substrate and the semiconductor layer along the grooves, and cleaving the crystalline substrate and the semiconductor layer in the area where the grooves are not formed to separate devices and to form the semiconductor device.

In the above-described manufacturing method, after forming scribed grooves on the above-described grooves, the step for cutting the crystalline substrate and the semiconductor layer to form a bar may be carried out.

In the present invention, the above-described first surface can be a cleaved surface, and the above-described second surface can be a surface formed using a method other than cleaving.

In the present invention, a mode wherein at least one of the lateral ends of the above-described sides is composed of the first surface, and the other region is composed of the second surface can be adopted.

The semiconductor device according to the present invention can be, for example, a semiconductor optical device. Specifically, a constitution having a light guide wherein the sides are formed along the light guide can be adopted.

In such a device, the mode having a light-outgoing surface or a reflective surface, wherein the area in the vicinity of the light-outgoing surface or the reflective surface is composed of the first surface, can be adopted. The reflective surface can be processed by mirror coating.

In the present invention, the second surface can be formed using dry etching and scribing. The second surface can also be formed using selective growth and scribing.

According to the present invention, since a device structure that has sides including a crystal plane and a plane other than the crystal plane is adopted, a semiconductor device that excels in the manufacturing efficiency and the device reliability, and a method for manufacturing such a semiconductor device can be provided.

DETAILED DESCRIPTION OF THE INVENTION AND PREFERRED EMBODIMENTS

Preferred embodiments of the present invention will be described below referring to the examples. In the following description, "chip separation" means a step for separating an LD chip from an LD bar.

EXAMPLE 1

Example 1 will be described referring to FIGS. 1, 2 and 3.

In the present invention, various crystalline substrates can be used, including semiconductor materials having hexagonal crystalline structures, such as group III nitride semiconductors. When a crystalline substrate having a surface dislocation density of less than $10^7/cm^2$ or $10^6/cm^2$ is used, the effect of the present invention is more noticeably exerted. Also when a semiconductor layer having a surface dislocation density of less than $10^7/cm^2$ or $10^6/cm^2$ is used, the effect of the present invention is more noticeably exerted.

Figure 1:
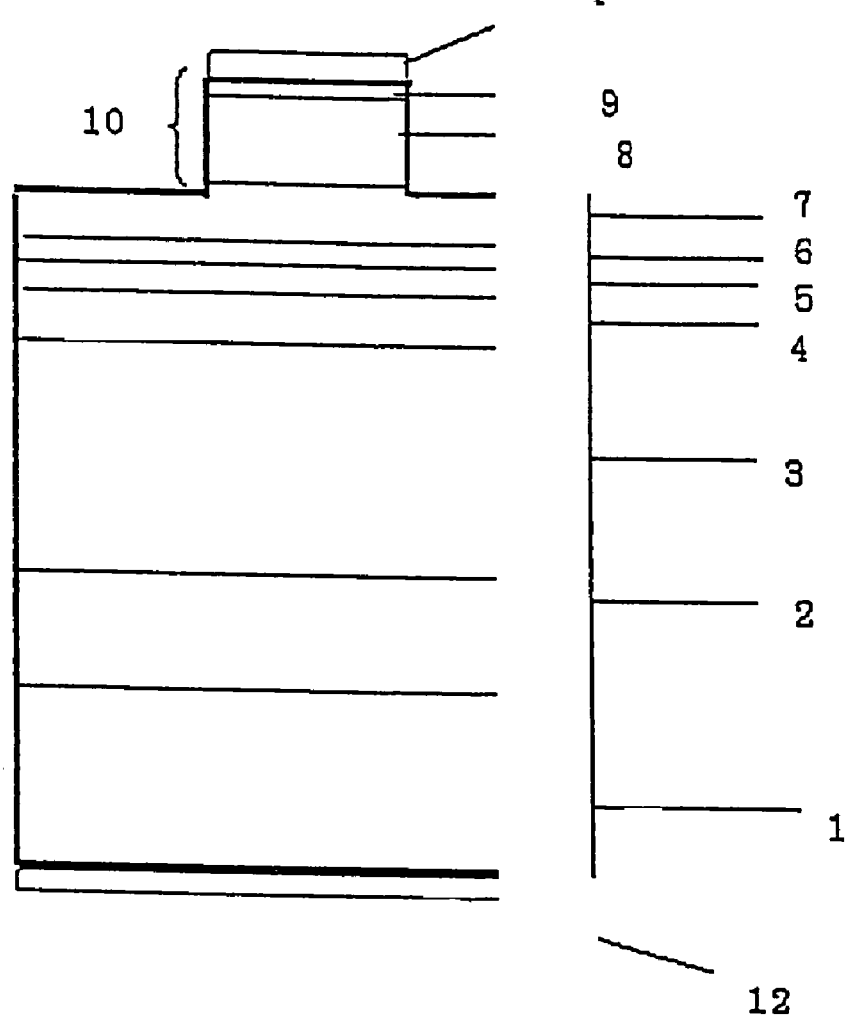
FIG. 1 is a sectional view schematically showing the sectional structure of a semiconductor device according to the embodiment.
Figure 2:
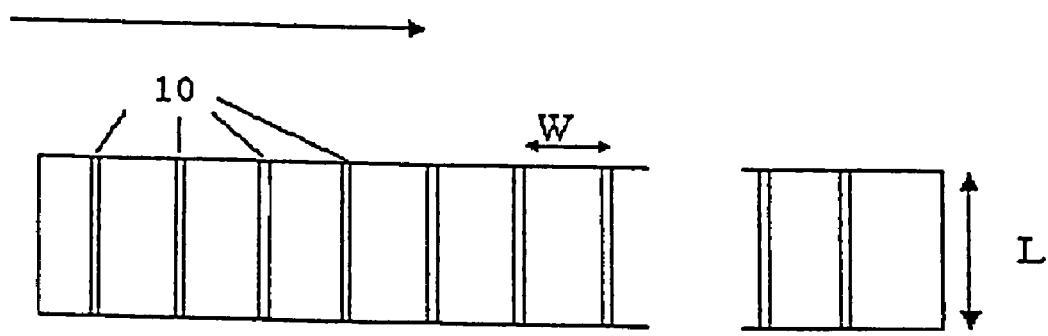
FIG. 2 is a diagram for illustrating the method for manufacturing a semiconductor device according to the embodiment.

FIG. 1 is a diagram showing the cross-sectional structure of a semiconductor laser (hereafter referred to as "LD") according to the present invention. The LD layer structure was formed by an MOVPE method using a hexagonal GaN substrate 1 (substrate dislocation density: $1 \times 10^6/cm^2$).

The following layers are sequentially grown on a GaN substrate 1 to form an LD structure. Specifically, a Si-doped n-GaN layer 2;

an n-type clad layer 3 consisting of Si-doped n-type $Al_{0.06}Ga_{0.94}N$ (silicon concentration: $4 \times 10^{17}$ $cm^{-3}$, thickness: 1.8 μm);

an n-type light containment layer 4 consisting of Si-doped n-type GaN (silicon concentration: $4 \times 10^{17}$ $cm^{-3}$, thickness: 0.1 μm);

a multiple quantum well (MQW) layer 5 (number of wells: 3) consisting of $In_{0.08}Ga_{0.92}N$ well layer (thickness: 4 nm) and Si-doped $In_{0.02}Ga_{0.98}N$ barrier layer (silicon concentration: $5 \times 10^{18}$ $cm^{-3}$, thickness: 6 nm);

a cap layer 6 consisting of Mg-doped p-type $Al_{0.17}Ga_{0.83}N$;

a p-type light containment layer 7 consisting of Mg-doped p-type GaN (Mg concentration: $2 \times 10^{17}$ $cm^{-3}$, thickness: 0.1 μm);

a p-type clad layer 8 consisting of Mg-doped p-type $Al_{0.7}Ga_{0.93}N$ (Mg concentration: $2 \times 10^{17}$ $cm^{-3}$, thickness: 0.5 μm); and a p-type contact layer 9 consisting of Mg-doped p-type GaN (Mg concentration: $2 \times 10^{17}$ $cm^{-3}$, thickness: 0.1 μm) are sequentially grown.

Thereafter, a resist stripe mask is formed in the (11-20) direction using a normal photo lithography technique, and etching is performed using a dry etching method to form a ridge stripe portion 10. Then a p-electrode 11 consisting of Ni/Pt/Au is formed in the p-contact layer side. The n-substrate side is polished to a thickness of 100 μm, and an n-electrode 12 consisting of Ti/Al is formed.

Figure 8:
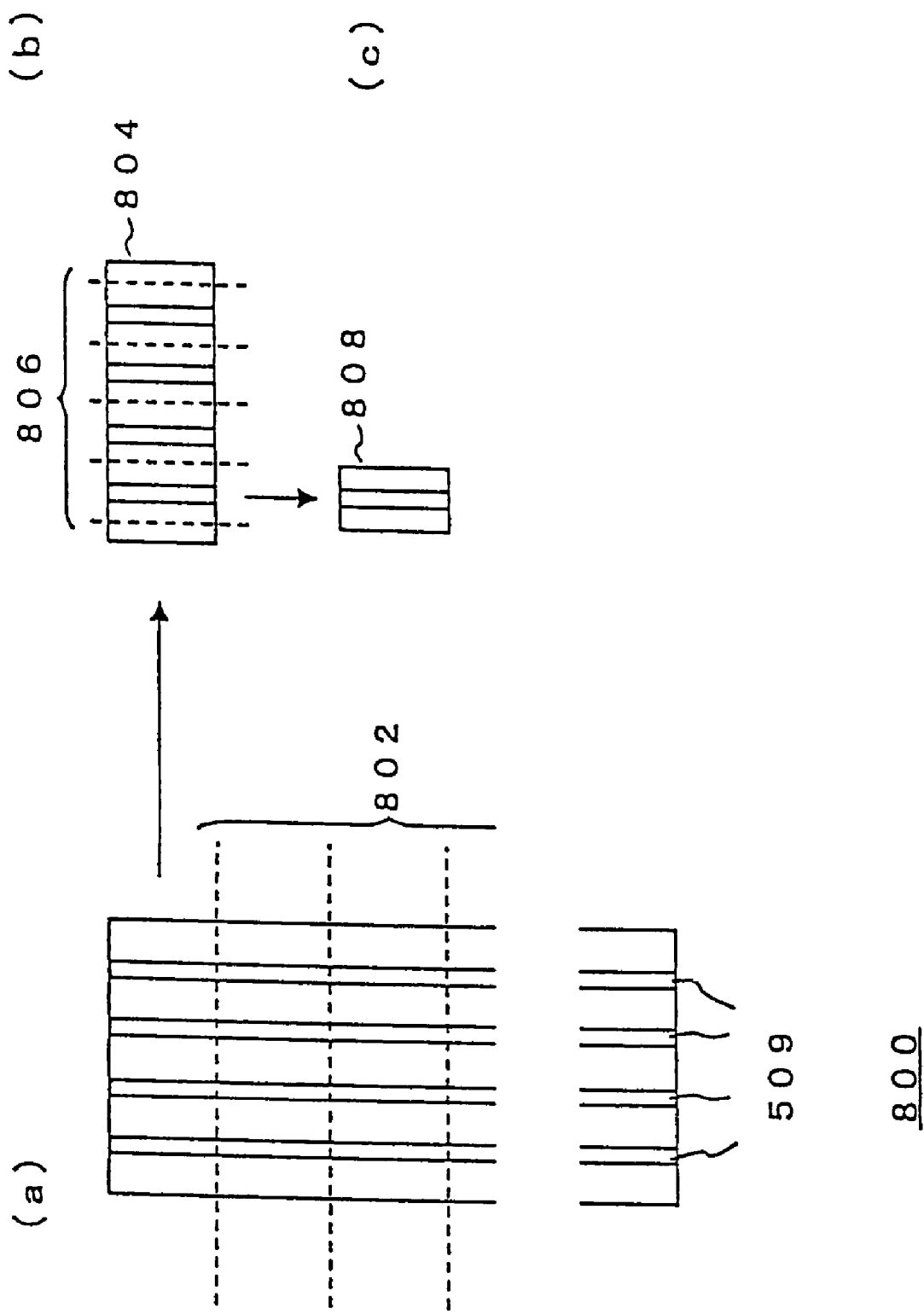
FIG. 8 is a diagram for illustrating the method for manufacturing a semiconductor device according to the embodiment.

After the completion of the above process, the laser resonator bar (hereafter referred to as "LD bar") is isolated, and chip separation is performed. These steps will be outlined referring to FIG. 8. First, a wafer 800 is cleaved at the cleaved plane 802 along the direction orthogonal to the extending direction of the mesa portion 509 and the isolation trench (not shown) to form a laser bar (FIG. 8(a)). Next, each bar is separated (FIGS. 8(b) and 8(c)). Thus, a semiconductor device can be obtained. In FIGS. 8(b) and 8(c), although the chip separation plane (sides of devices) are drawn in parallel to the extending direction of the resonator, the actual chip separation plane have a multifaceted structure composed of cleaved surfaces and scribed surfaces.

The above process will be specifically described. First, a wafer is cleaved in the <1-100> direction to form a laser resonator. Thereby, an LD bar as shown in FIG. 2 is formed. In the LD bar, ridge stripe portions 10 shown in FIG. 1 are formed in a cycle W (W=300 μm in Example 1). The resonator length is a length L in FIG. 2 (L=800 μm in Example 1). Highly reflective coating is performed on a side of the formed LD bar, and chip separation is performed. In the chip separation, the front surface of a GaN crystal (semiconductor growth layer) is scratched (scribed) using a scriber, and the GaN crystal is broken using a ceramic blade from the back surface of the substrate. The tip portion of needle of the scribed is made of diamond, and the needle is tilted by 45° to the traveling direction of the needle to form a scribed groove 13. When the GaN crystal was scribed 5 times setting the load of the scriber to 20 g, a groove of about 5 μm from the surface of the GaN crystal was formed.

Figure 3:
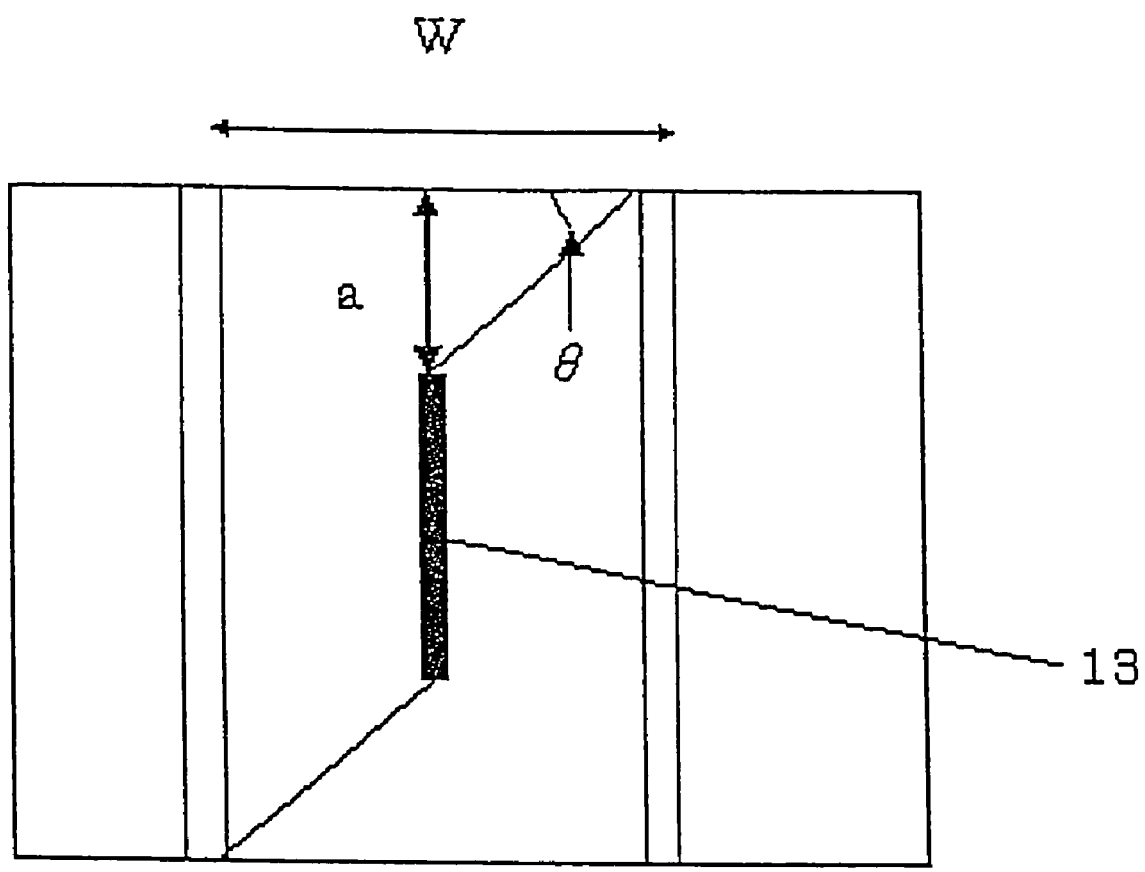
FIG. 3 is a diagram for illustrating the method for manufacturing a semiconductor device according to the embodiment.

FIG. 3 is a top view of the LD bar on which the scribed groove 13 is formed. As FIG. 3 shows, scribed groove 13 is not formed on the entire region of the resonator, but the regions where no groove is formed are left in the both ends of the bar. The length of each region is a μm (a=50 μm in this example). In this example, since the angle θ shown in FIG. 3 is 30°, the distance a from the end surface to the end of the scribed groove should be W/2 tan θ (W=300 μm, θ=30°)=86 μm or less.

After these scribed grooves had been formed, when breaking was performed at a speed of the breaking blade of 100 μm/sec, as FIG. 3 shows, the area where the scribed groove had been formed was broken along the scribed groove, and the area where no scribed grooves had been formed could be cleaved along the crystal face, and devices could be preferably separated.

Although the scribed grooves are formed from the p-electrode side in this example, they can be formed from the n-electrode side. Although the breaking blade was entered from the n-electrode side in Example 1, it can be entered from the p-electrode side.

Figure 6:
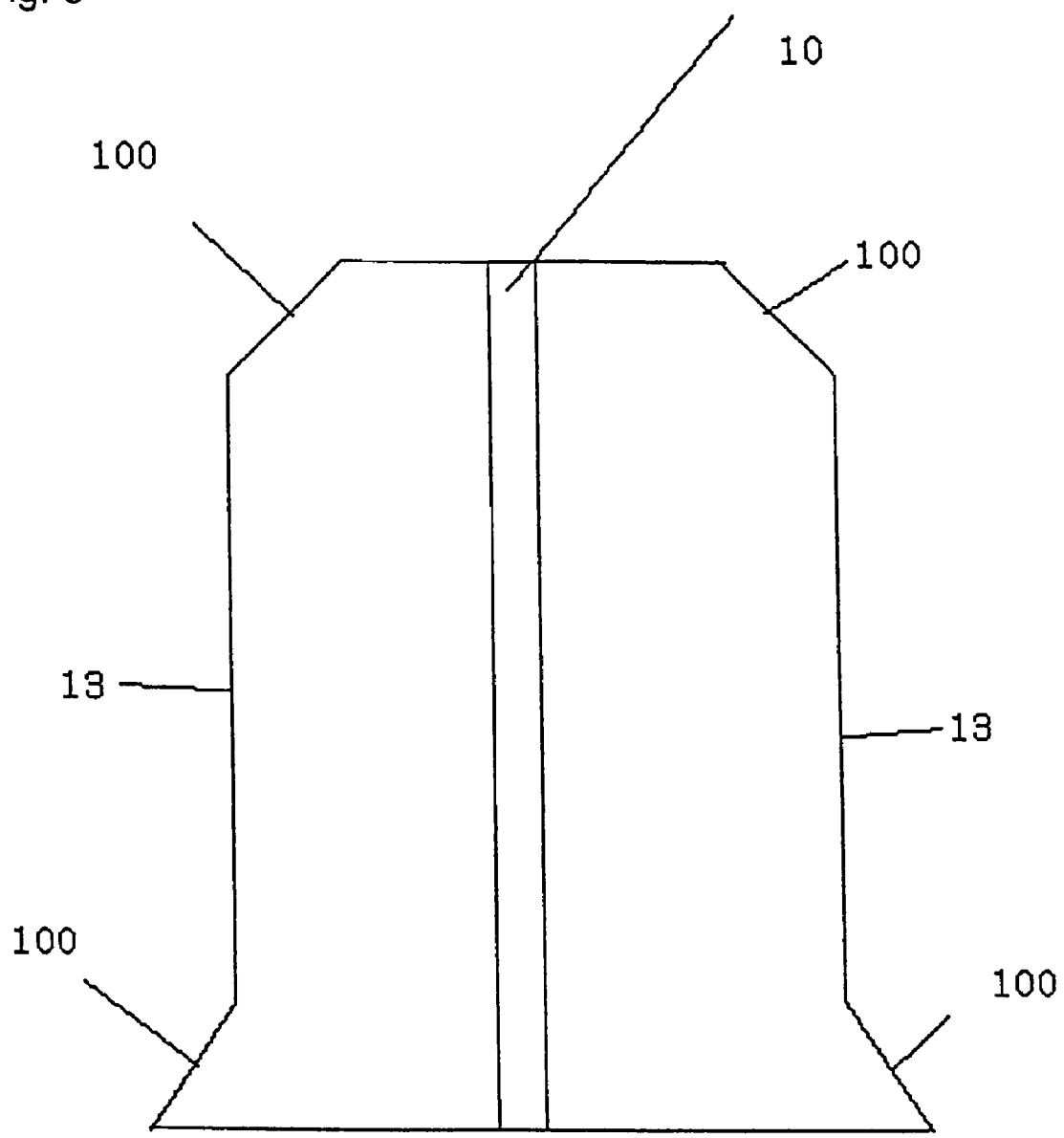
FIG. 6 is a top view schematically showing the structure of a semiconductor device according to the embodiment.
Figure 7:
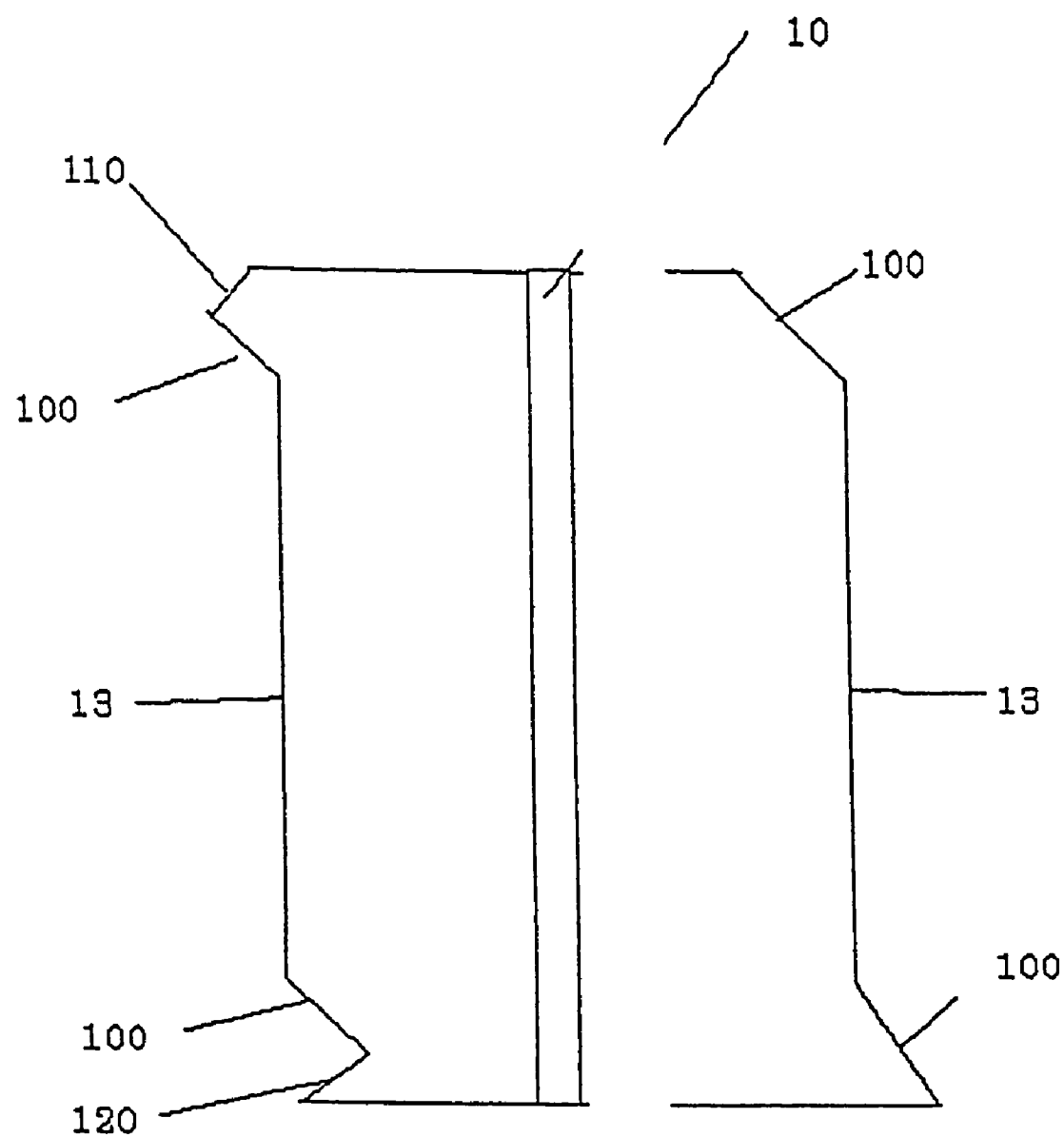
FIG. 7 is a top view schematically showing the structure of a semiconductor device according to the embodiment.

The device obtained in this example is shown in FIGS. 6 and 7. In FIG. 6, chip separation is performed along the cleavage plane 100 from the scribed grooves 13. The cleavage planes 100 are broken in the equivalent direction as <1-100>. FIG. 7 is an example when the direction of a cleaved surface shown in FIG. 6 is changed along the way. In this case, the direction of chip separation is changed from the cleavage plane 100 to the cleavage plane 110 or 120. The cleavage plane 110 or 120 is equivalent to the <1-100> plane, and depending on the conditions of chip separation, devices are isolated in such patterns. Since the end surface of the device separated under such conditions ends at cleavage, the device is little damaged, no delamination of the coating film occurs particularly in the ridge portion, and the yield is significantly improved to substantially 100%.

EXAMPLE 2

Example 2 will be described referring to FIGS. 1, 3 and 4. The structure of the LD layer is the same as that described for Example 1. In Example 2, steps until the p-electrode and an n-electrode are carried out in the state of a wafer, and thereafter, the wafer is divided into chips.

Figure 4:
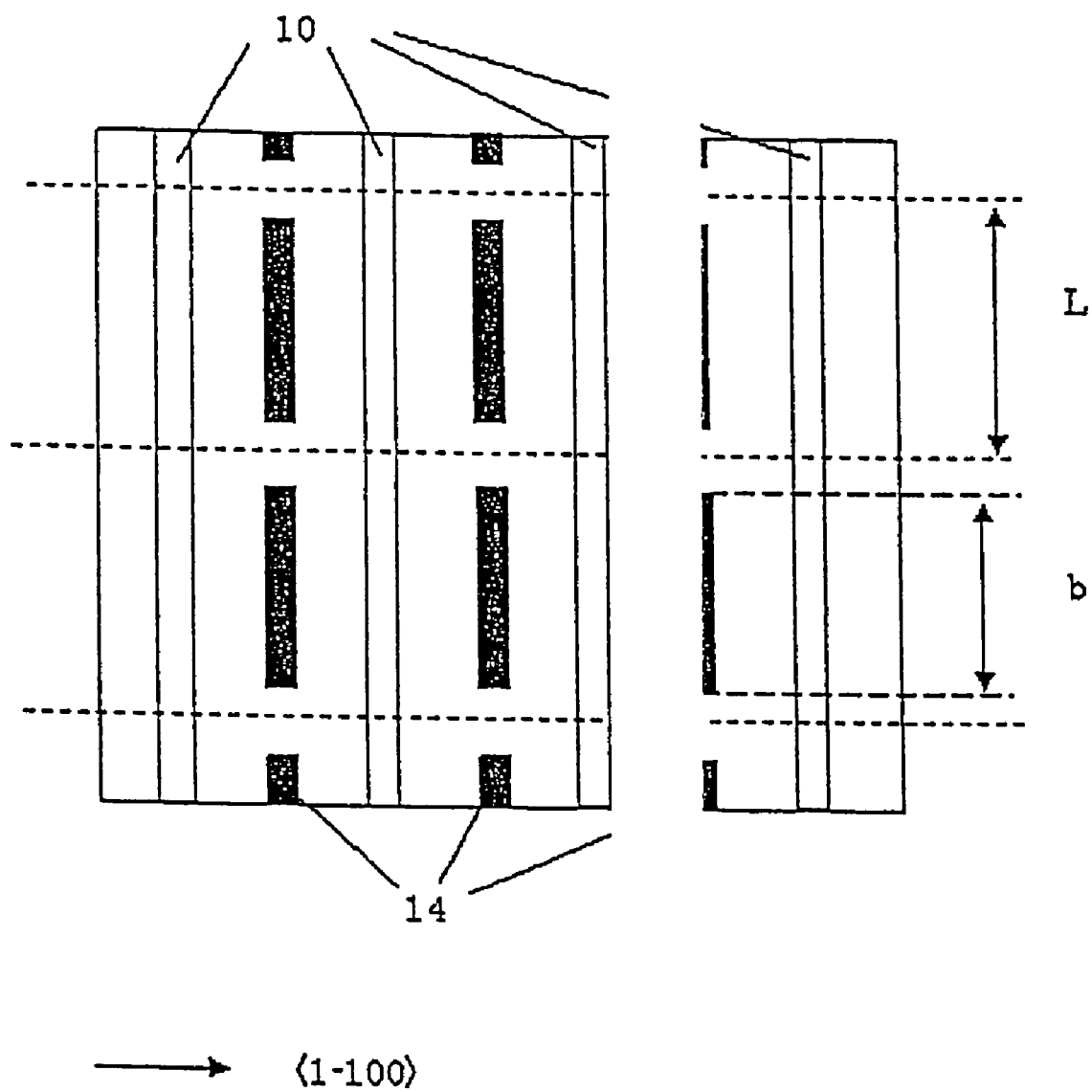
FIG. 4 is a diagram for illustrating the method for manufacturing a semiconductor device according to the embodiment.

In Example 2, different from Example 1, the chip separation grooves 14 are formed after the ridge stripe portions 10 have been formed using dry etching as FIG. 4 shows. The chip separation grooves are formed using dry etching after patterning by an exposure technique using a resist as FIG. 4 shows.

The length b of the isolating groove is a length that satisfies the condition of b≧L−W tan θ described in FIG. 3 of Example 1. For example, when W=300 μm, θ=30° and L=800 μm, the length b of the isolating groove 14 can be 626 μm or longer. In this example, b=700 μm. The depth and the width of the isolating groove 14 are 5 μm and 10 μm, respectively. After forming such isolating grooves in the entire region in the wafer, LD bars shown with broken lines in FIG. 4 are formed. Thereafter, low reflective coating (reflection coefficient: 8%) using SiO$_2$ is performed to the laser output end, and high reflective coating (reflection coefficient: 95%) using SiO$_2$/TiO$_2$ is performed to the output end of the laser.

Such LD bars are broken from the back face of the substrate using a breaking blade. When the speed of the breaking blade is 200 μm/sec, and the push-in depth is 150 μm, as FIG. 3 shows, the areas on which the scribed groove are formed are broken along the grooves, and the areas on which no grooves are formed can be cleaved in the cleavage direction to separate the devices. When chip separation is thus performed by forming chip separation grooves, the end surface ends by cleavage as in Example 1, and therefore, chip separation can be performed while preventing damages.

EXAMPLE 3

This example is described referring to FIGS. 3 and 4. In this example, the combination of dry etching and scribing is used to form isolating grooves, and thereby, the damage of devices during breaking is prevented, and the contact of a part of the p-electrode to the n-semiconductor layer is avoided.

In this example, in the same manner as FIG. 4 of Example 2, LD bars on which chip separation grooves are formed using dry etching are used. On the back side of the LD bars (opposite to the light outgoing side), high reflective coating is performed, and the laser outgoing surface is a cleavage plane. Using these LD bars, scribed grooves overlying the location to form dry-etching grooves are formed. The scribed grooves are formed by scratching (grooving) a GaN crystal from the surface of the wafer using a scriber. After forming the scribed grooves, chip separation is performed by breaking using a ceramic blade from the back face of the substrate. The tip of the scriber needle is formed of diamond, and the needle is tilted by 40° to form the scribed grooves 13 as shown in FIG. 3. When the scribing load was 15 g, and scribing was performed 5 times, the grooves of a depth of about 4 μm from the surface of the GaN crystal were formed.

As FIG. 3 shows, scribed grooves 13 were not formed in the entire region of the resonator, but spaces of a μm were left in the both ends (a=50 μm in Example 1). After forming these scribed grooves, when breaking was performed at a speed of the breaking blade of 100 μm/sec, and a push-in depth of 50 μm, as FIG. 3 shows, the areas on which the scribed grooves were formed were broken along the grooves, and the areas on which no grooves were formed could be cleaved in the cleavage direction to isolate the devices. Thus, the combination of isolating grooves formed by dry etching and isolating grooves formed by scribing can reduce the impact of breaking.

In a semiconductor device having a laminated structure of a nitride semiconductor material, since the lattices in each layer are not aligned to each other, a large impact may easily cause a new dislocation in the crystal. The dislocation caused has characteristics to propagate in the facial direction, and as a result, dislocation increases also in the crystal passing electric current, and significantly affects the LD characteristics and the usable life. The allowance of impact depends on layer structures. For example, when the thickness or the Al content of an AlGaN clad layer is increased, impact must be reduced. When impact is reduced as much as possible during chip separation, the method of forming a scribing groove superposed on a groove formed by dry etching according to the present invention is preferably used. In this example, although the breaking step is carried out with reduced scribing and impact, if the number and load of scribing are increased, chip separation can be performed without using the breaking step.

EXAMPLE 4

This example will be described referring to FIGS. 4 and 5. In the above-described examples, although the chip separation grooves are formed using scribing or dry etching, in this example, a method for forming chip separation grooves using selective growth will be described.

Figure 5:
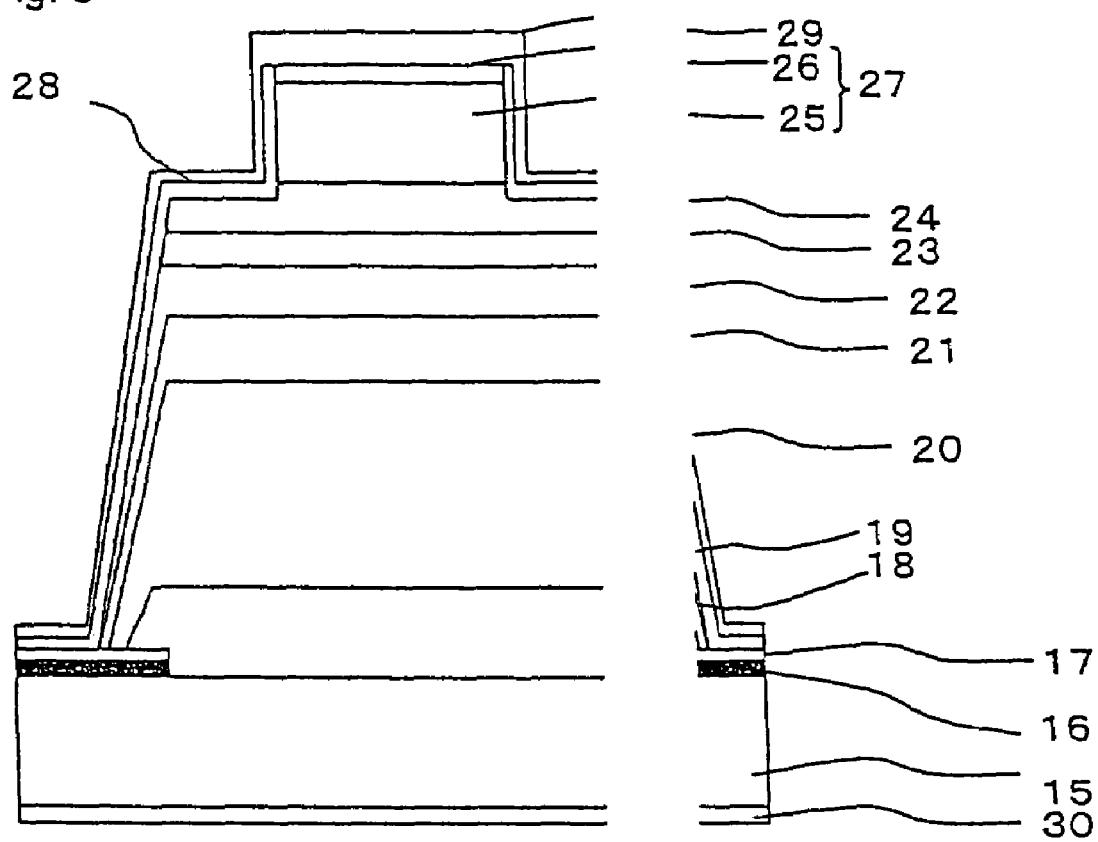
FIG. 5 is a sectional view schematically showing the sectional structure of a semiconductor device according to the embodiment.

FIG. 5 is a sectional view of the structure of an LD. A method for forming this layer structure will be described below. First, a GaN substrate 15 having a dislocation density in the vicinity of the substrate surface of $9 \times 10^6$ cm$^2$ is prepared, am SiO$_2$ film is deposited thereon using a CVD method, and an AlN polycrystalline film is further deposited thereon using a sputtering method. Next, a resist mask extending in the <11-20> direction is formed on the AlN polycrystalline film.

No semiconductor layers are formed on the area coated with the resist mask, and through the subsequent semiconductor growing step, isolating grooves are formed in the area where the mask is formed. The isolating grooves are formed ad isolating grooves 14 of a stripe pattern as shown in FIG. 4. The length b of an isolating groove is a length that satisfies the condition of b≧L−W tan θ described in FIG. 3 of Example 1. For example, when W=300 μm, θ=30° and L=800 μm, the length b of the isolating groove 14 can be 626 μm or longer. The width of the mask is 18 μm, and the width of the opening is 200 μm. The AlN polycrystalline film 17 and the SiO$_2$ film 16 are etched, to expose the surface of the substrate in the opening 18.

Using a wafer having the mask formed thereon, a Si-doped GaN layer is formed in the opening by an MOVPE method, and grown in the lateral directions. Thereby, a planarized n-GaN layer 19 is formed.

Thereafter, an n-type clad layer 20 consisting of Si-doped n-type Al$_{0.1}$Ga$_{0.9}$N (silicon concentration: $4 \times 10^{17}$ cm$^{-3}$, thickness 1.2 μm); an n-type light-containment layer 21 consisting of Si-doped n-type GaN (silicon concentration: $4 \times 10^{17}$ cm$^{-3}$, thickness 0.1 μm); a multiple quantum well (MQW) layer 22 (number of wells: 3) consisting of an In$_{0.2}$Ga$_{0.8}$N well layer (thickness: 4 nm) and an Si-doped In$_{0.05}$Ga$_{0.95}$N barrier layer (silicon concentration: $5 \times 10^{18}$ cm$^{-3}$, thickness: 6 nm); a cap layer 23 consisting of Mg-doped p-type Al$_{0.2}$GA$_{0.8}$N; a p-type light containment layer 24 consisting of Mg-doped p-type GaN (Mg concentration: $2 \times 10^{17}$ cm$^{-3}$, thickness: 0.1 μm); a p-type clad layer 25 consisting of Mg-doped p-type Al$_{0.1}$Ga$_{0.9}$N (Mg concentration: $2 \times 10^{17}$ cm$^{-3}$, thickness: 0.5 μm); and a p-type contact layer 26 consisting of Mg-doped p-type GaN (Mg concentration: $2 \times 10^{17}$ cm$^{-3}$, thickness: 0.1 μm) are sequentially grown to form an LD layer structure. Thereafter, a normal exposure technique is used to form a resist stripe mask in a <11-20> direction, and etching is performed using a dry etching method to form a ridge 27. Thereafter, a SiO$_2$ dielectric film 28 and a p-electrode 29 consisting of Ni/Pt/Au are formed in the p-substrate side; and an n-electrode 30 consisting of Ti/Al is formed in the n-substrate side.

The wafer having chip separation grooved fabricated as described above is cleaved to form resonators (LD bars) shown with broken lines in FIG. 4. Thereafter, to the laser output end, low reflective coating (reflection coefficient: 5%) using SiO$_2$ is performed, and to the output end of the laser, high reflective coating (reflection coefficient: 95%) using SiO$_2$/TiO$_2$ is performed.

Such LD bars are broken from the back face of the substrate using a breaking blade. When the speed of the breaking blade is 150 μm/sec, and the push-in depth is 150 μm, as FIG. 3 shows, the areas on which the scribed groove are formed are broken along the grooves, and the areas on which no grooves are formed can be cleaved in the cleavage direction to separate the devices. When chip separation is thus performed by forming chip separation grooves, the end surface ends by cleavage as in Example 1, and therefore, chip separation can be performed while preventing damages.

EXAMPLE 5

This example is described referring to FIGS. 3, 4 and 5. In this example, the combination of selective growth and scribing is used to form isolating grooves, and thereby the damage of the device during breaking is suppressed.

In this example, an LD bar having chip separation grooves formed using selective growth similar to FIG. 5 of Example 4 is used. To the laser output end, low reflective coating (reflection coefficient: 5%) using SiO$_2$ is performed, and to the output end of the laser, high reflective coating (reflection coefficient: 95%) using SiO$_2$/TiO$_2$ is performed. Using these LD bars, scribed grooves overlying the location to form dry-etching grooves are formed. The scribed grooves are formed by scratching (grooving) a GaN crystal from the surface of the wafer. Thereafter, breaking is performed using a ceramic blade from the back face of the substrate. The tip of the scriber needle is formed of diamond, and the needle is tilted by 45° to form the scribed grooves 13 as shown in FIG. 3. When the scribing load was 20 g, and scribing was performed 5 times, the grooves of a depth of about 5 μm from the surface of the GaN crystal were formed. As FIG. 3 shows, scribed grooves 13 were not formed in the entire region of the resonator, but spaces of a μm were left in the both ends. After forming these scribed grooves, when breaking was performed at a speed of the breaking blade of 100 μm/sec, and a push-in depth of 50 μm, as FIG. 3 shows, the areas on which the scribed grooves were formed were broken along the grooves, and the areas on which no grooves were formed could be cleaved in the cleavage direction to isolate the devices. Thus, the combination of isolating grooves formed by dry etching and isolating grooves formed by scribing can reduce the impact of breaking.

In the layer structure of a nitride semiconductor, since the lattices in each layer are not aligned to each other, a large impact may easily cause a new dislocation in the crystal. The dislocation caused has characteristics to propagate in the facial direction, and as a result, dislocation increases also in the crystal passing electric current, and significantly affects the LD characteristics and the usable life. The allowance of impact depends on layer structures. For example, when the thickness or the Al content of an AlGaN clad layer is increased, impact must be reduced. When impact is reduced as much as possible during chip separation, the method of forming a scribing groove in a preformed chip separation groove according to the present invention is preferably used. In this example, although the breaking step is carried out with reduced scribing and impact, if the number and load of scribing are increased, chip separation can be performed without using the breaking step.

The side of the device (chip separation plane) according to the above-described example is composed of a crystal face (cleavage plane) of the GaN substrate, and a surface other than the crystal face of the GaN substrate (non-cleavage plane formed using scribing, dry etching and selective growth). Therefore, the damage of device during chip separation can be effectively suppressed while preferably maintaining the yield in chip separation, and a semiconductor device that excels in production efficiency and device reliability can be obtained.

According to the present invention, since a device structure that has sides including a crystal plane and a plane other than the crystal plane is adopted, a semiconductor device that excels in the manufacturing efficiency and the device reliability, and a method for manufacturing such a semiconductor device can be provided.

What is claimed is:

1. The semiconductor device comprising a crystalline substrate, and a semiconductor layer laminated on said crystalline substrate; wherein
   at least one side of said semiconductor device includes a first surface including the crystal face of said crystalline substrate, and a second surface including a surface other than the crystal face of said crystalline substrate;
   said semiconductor device further comprising a light guide, and
   said side is formed along said light guide.

2. The semiconductor device according to claim 1; wherein
   said first surface is a cleavage plane, and
   said second surface is a surface formed by a method other than cleavage.

3. The semiconductor device according to claim 1; wherein
   at least one of the lateral ends of said side is composed of said first surface, and
   the other region is composed of said second surface.

4. The semiconductor device according to claim 1; wherein further having a light outgoing surface or a reflective surface formed substantially perpendicularly to the light guide direction, and the area in the vicinity of said light outgoing surface or said reflective surface in said side is composed of said first surface.

5. The semiconductor device according to claim 4; wherein said reflective surface is subjected to mirror coating.

6. The semiconductor device according to claim 1; wherein said crystalline substrate has a crystal structure which is hexagonal system.

7. The semiconductor device according to any of claim 1; wherein
   said crystalline substrate consists of a group III nitride semiconductor material.

8. The semiconductor device according to any of claim 1; wherein
   said second surface is a surface formed by dry etching and scribing.

9. The semiconductor device according to claim 1; wherein
   said second surface is a surface formed by selective growing and scribing.

10. A method for manufacturing a semiconductor device as claimed in claim 1; comprising steps of;
    forming a semiconductor layer on a crystalline substrate;
    selectively removing said crystalline substrate or said semiconductor layer, and forming a plurality of grooves extending in a direction on a part of a device separating region;
    cleaving said crystalline substrate and said semiconductor layer along a surface substantially orthogonal to the extending direction of said grooves, and not intersecting said grooves to form a bar; and
    performing breaking along the extending direction of said grooves, cutting the crystalline substrate and the semiconductor layer along said grooves, and cleaving the crystalline substrate and the semiconductor layer in the area where said grooves are not formed to separate devices and to form the semiconductor device.

11. A method for manufacturing a semiconductor device according to claim 10, wherein
    the method further comprises a step of forming scribed grooves overlying said grooves, prior to the step of cleaving said crystalline substrate and said semiconductor layer to form a bar.

12. A method for manufacturing a semiconductor device as claimed in claim 1; comprising steps of;
    for forming a plurality of striped masks extending in a direction on a crystalline substrate;
    selectively growing a semiconductor layer while forming grooves from the opening of said mask to immediately above said mask;
    cleaving said crystalline substrate and said semiconductor layer along a surface substantially orthogonal to the extending direction of said grooves, and not intersecting said grooves to form a bar; and
    performing breaking along the extending direction of said grooves, cutting the crystalline substrate and the semiconductor layer along said grooves, and cleaving the crystalline substrate and the semiconductor layer in the area where said grooves are not formed to separate devices and to form the semiconductor device.

13. A method for manufacturing a semiconductor device according to claim 12, wherein
    the method further comprises a step of forming scribed grooves overlying said grooves, prior to the step of cleaving said crystalline substrate and said semiconductor layer to form a bar.

* * * * *